(12) United States Patent
Feuerbaum et al.

(10) Patent No.: US 6,555,824 B1
(45) Date of Patent: Apr. 29, 2003

(54) METHOD AND DEVICE FOR FOCUSING A CHARGED PARTICLE BEAM

(75) Inventors: Hans-Peter Feuerbaum, Munich (DE); Dieter Winkler, Munich (DE)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/397,803

(22) Filed: Sep. 16, 1999

(30) Foreign Application Priority Data

Sep. 25, 1998 (EP) ............................................ 98118175

(51) Int. Cl.[7] ............................................. H01J 37/145
(52) U.S. Cl. ............................. 250/396 R; 250/396 ML
(58) Field of Search ................... 250/396 R, 396 ML, 250/398

(56) References Cited

U.S. PATENT DOCUMENTS 4,546,258 A * 10/1985 Chisholm ............... 250/396 R
5,187,371 A * 2/1993 Matsui et al. ........... 250/396 R
6,051,838 A * 4/2000 Frosien et al. .......... 250/396 R

FOREIGN PATENT DOCUMENTS

| EP | 0721201 | 7/1996 |
| EP | 0790634 | 8/1997 |
| JP | 61101944 | 5/1986 |

OTHER PUBLICATIONS

"Compound Magnetic and Electrostatic Lenses for Low–Voltage Applications", 8257b Journal of Vacuum Science & Technology 7(1989) Nov./Dec., No. 6, pp. 1874–1877.

* cited by examiner

Primary Examiner—Bruce Anderson
(74) Attorney, Agent, or Firm—Michael B. Einschlag

(57) ABSTRACT

The invention provides an objective lens 1 for focusing a charged particle beam 30 on a specimen. The objective lens comprises a first focusing lens 2 positioned between a charged particle source and the specimen for finely focusing the beam of charged particles on the specimen. The objective lens further comprises a second focusing electrostatic lens 20 positioned between the first focusing lens and the specimen for coarsely focusing the beam of charged particles on the specimen.

12 Claims, 2 Drawing Sheets

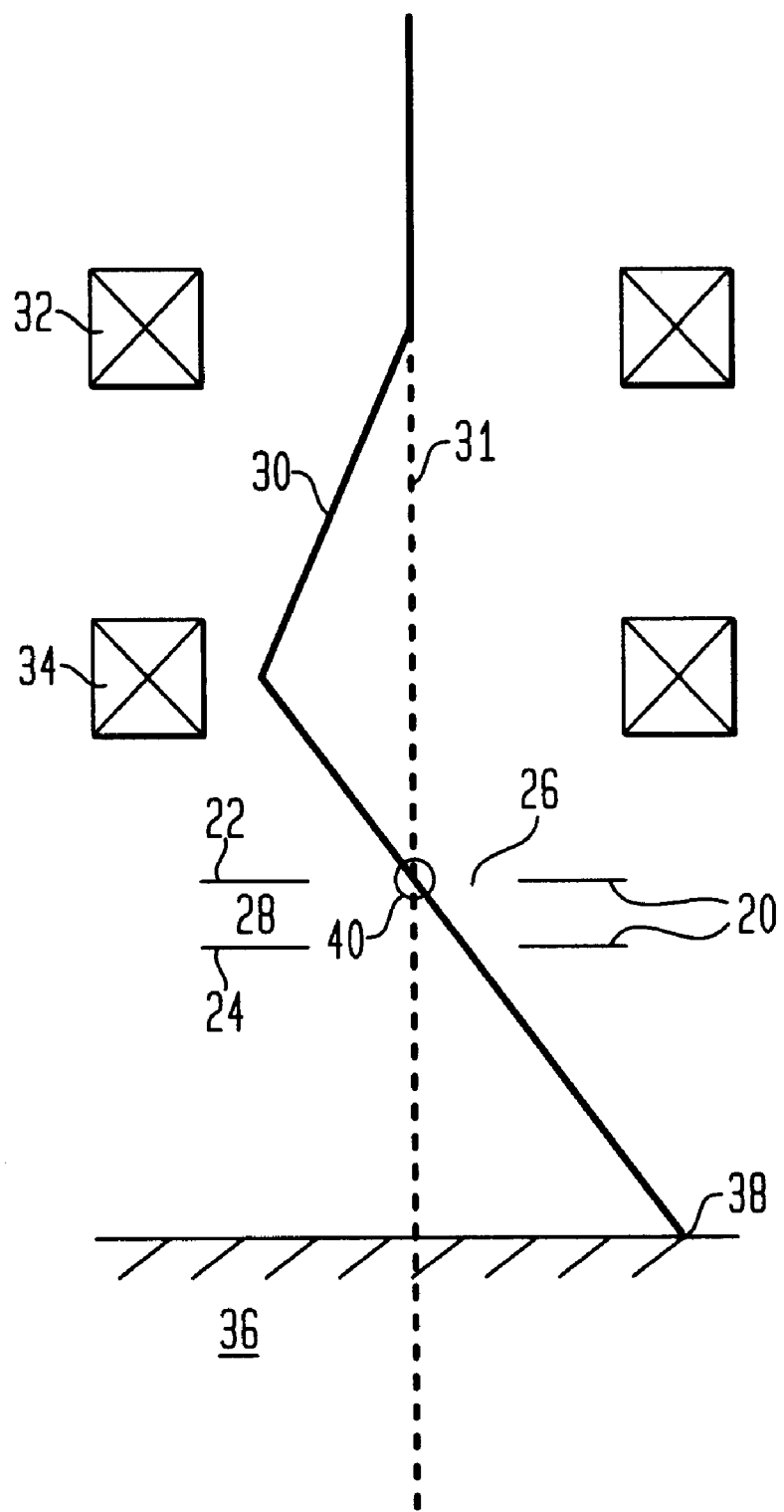

METHOD AND DEVICE FOR FOCUSING A CHARGED PARTICLE BEAM

FIELD OF THE INVENTION

The invention relates to a method and an apparatus for the examination of specimen with a beam of charged particles. In particular, this invention relates to an objective lens and a method for focusing a beam of charged particles onto a specimen.

BACKGROUND OF THE INVENTION

Charged particles e.g. electrons, negatively or positively charged ions coming from a particle source can be accelerated and shaped into a beam by applying electric and magnetic fields. Different electro-optical devices are used to guide the beam and finally to focus it onto a specimen or sample. When a particle of the incident beam strikes the surface of the specimen, it undergoes a series of complex interactions with the nuclei and electrons or the atoms of the specimen. The interactions produce a variety of secondary products, such as electrons, X-rays, heat and light. Many of these secondary products are used to produce images of the specimen, e.g. its surface structure, and to collect additional data from the specimen.

Commonly, an objective lens focuses the beam on the specimen. The objective lens cannot produce an infinitely small spot size due to lens aberrations but instead produces a narrowed spot which represents a demagnified image of the beam source. The diameter of the spot can be controlled, for example, by reducing the focal length of the objective lens which results in a spot of smaller diameter on the specimen. In general, the smaller the spot size, the better the resolution. It is becomes increasingly difficult to resolve any two structures whose spacing is less than the diameter of the beam of charged particles. Thus, the spot size is crucial for image quality and resolving power.

Two lens defects, spherical and chromatic aberration, are mainly responsible for the minimum spot size that can be reached and thus the resolution of devices known in the art. Spherical aberration causes electrons with a trajectory further from the optical axis to be deflected stronger than electrons with a trajectory closer to the optical axis. This results in an enlargement of the spot size. Chromatic aberration is the result of charged particles in the beam having different velocities and thus different wavelengths. The differing wavelengths cause the charged particles to be brought to focus at different points along the optical axis, which blurs the image. Both of these lens defects depend on the focal length of the objective lenses i.e. the distance between the principal plane of the lens and the specimen to be examined. A shorter focal length and therefore smaller lens defects can be obtained, for example, by an overall reduction of the lens dimensions.

In magnetic lenses, a short focal length is achieved by concentrating the magnetic flux generated by the excitation coils into a small area. At the same time, the pole piece gap and the center bore of the lens body are kept at minimal dimensions. A reduction of the geometrical dimensions of magnetic lenses to further reduce the focal length is, however, limited by the fact that the lens requires a given volume for the windings in order to obtain the necessary field strength. Furthermore, it is not possible to increase the current density in the excitation coils beyond certain limits due to the undesirable production of heat in the coils.

In electrostatic lenses, a short focal length can be obtained by increasing the strength of the electrical field. The occurrence of discharge effects, however, sets a limit to such an approach. Also, strong electrical fields prevailing on the specimen's surface can result in imaging artifacts. An alternative way of reducing the focal length is to reduce the overall dimension of an electrostatic lens, in particular, the distance between the electrodes and the size of their apertures. Such a reduction can be achieved quite easily, however, the disadvantages entailed by this approach are the increasing difficulties in integrating elements like deflecting coils or stigmators.

In other electro-optical devices, magnetic and electrostatic lenses are combined into one objective lens. Frosien et al (EP 0 274 622 and 0 333 018) disclose a compound lens wherein the electrodes of the electrostatic lens are disposed within the magnetic lens. Compared with a simple magnetic lens, such a combination results in reduced aberrations. Adjustments of the focal length of such a lens result in variations of the electrical field prevailing on the surface of the specimen. These variations in turn cause deviations in the path of secondary electrons and thereby influence the image quality. In addition, the variations of the electrical field cause various effects due to charging of the insulating samples which influence the image quality as well. As optional preventive measures, additional shielding electrodes have been mounted between the compound lens and the specimen. Such additional shielding, however, limits the reduction of the focal length since it is positioned between the lens and the sample.

SUMMARY OF THE INVENTION

The present invention intends to provide an improved lens and method for focusing a charged particle beam on a specimen. According to one aspect of the present invention, there is provided an objective lens as specified in independent claim 1.

According to a further aspect of the present invention, there is provided a method as specified in independent claim 9.

Further advantages, features, aspects and details of the invention are evident from the dependent claims, the description and the accompanying drawings. The claims are intended to be understood as a first non-limiting approach of defining the invention in general terms.

According to a further aspect of the present invention, there is provided an objective lens for focusing a charged particle beam on a specimen. The objective lens comprises a first focusing lens positioned between a charged particle source and the specimen for finely focusing the beam of charged particles on the specimen. The objective lens further comprises a second focusing lens positioned between the first focusing lens and the specimen for coarsely focusing the beam of charged particles on the specimen.

The combination of a first finely focusing lens followed by a second coarsely focusing electrostatic lens into one objective lens allows the reduction of the distance between the principal plane of the objective lens and the specimen. This, in turn, results in a shorter focal length which entails a smaller probe diameter and a higher resolving power.

According to a still further aspect of the present invention, there is provided a first focusing magnetic lens followed by a second focusing electrostatic lens. This combination of two focusing lenses allows a considerable reduction of the focal length of the objective lens and achieves a high resolving power. Thereby, the magnetic lens has the advantage of being able to perform a fine focusing without influencing the field above the sample surface. In addition, due to its miniaturization, the electrostatic lens has the advantage of further reducing the focal length. This shifts the principal plane of the objective lens closer to the sample. The objective lens system can fully operate, and parameters like the primary energy of the charged particles can be selected freely. Further, there are no limitations with respect to scanning and correcting features if such features are used in combination with the objective lens.

In a preferred embodiment according to the invention, the second focusing electrostatic lens is miniaturized. Preferably, the first focusing magnetic lens comprises scanning and correcting devices in case such devices are used in particular applications.

According to still another aspect of the present invention, there is provided an objective lens for focusing a charged particle beam on a specimen. The objective lens comprises a first focusing lens positioned between a charged particle source and the specimen for finely focusing the beam of charged particles on the specimen; the first focusing lens being a magnetic lens. The objective lens further comprises a second focusing lens positioned between said first focusing lens and the specimen for coarsely focusing the beam of charged particles on the specimen; the second focusing lens being a miniaturized electrostatic lens comprising at least two electrodes.

The invention is also directed to methods by which the described apparatus operates. It includes method steps for carrying out every function of the apparatus. Furthermore, the invention is also directed to apparatus for carrying out the disclosed methods and including apparatus parts for performing each described method step. These method steps may be performed by way of hardware components, a computer programmed by appropriate software, by any combination of the two or in any other manner.

BRIEF DESCRIPTION OF THE DRAWINGS

Some of the above indicated and other more detailed aspects of the invention will be described in the following description and partially illustrated with reference to the figures. Therein:

FIG. 3 shows a simplified cross section of the lower part of an optical column of a charged particle beam device.

DESCRIPTION OF THE PREFERRED EMBODIMENTS

Figure 1:
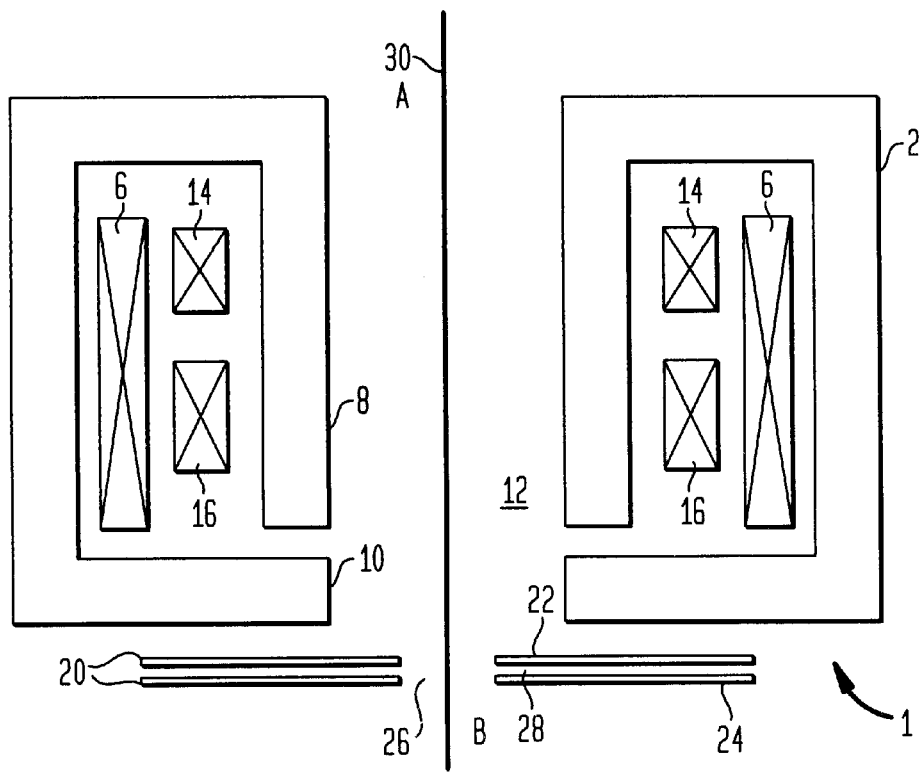
FIG. 1 shows a schematic vertical cross section of an objective lens according to the invention.

An objective lens according to the invention is shown schematically in FIG. 1. The objective lens comprises a magnetic lens 2 and an electrostatic lens 20. A beam of charged particles 30 enters the objective lens I at the top 35 A of magnetic lens 2 and, after having been focused by magnetic lens 2 and electrostatic lens 20, exits the objective lens at the bottom B of electrostatic lens 20. In a typical example shown in FIG. 1, the magnetic lens comprises an iron circuit energized by excitation coil 6. The maximum magnetic flux density of the magnetic lens is concentrated between the lower pole piece 10 and the upper pole piece 8 of the iron core. This magnetic flux can be increased by increasing the product of the coil windings and the excitation current NI (ampere turns) to magnetize the pole pieces. The focal length may be changed over a certain range by altering the excitation current.

In some applications, scanning coils 14 are supplied. A varying voltage produced by a scanning generator (not shown) creates a magnetic field that deflects the beam of charged particles back and forth in a controlled pattern. Furthermore, the magnetic lens may optionally comprise correction coils 16 for compensating the effects of imperfections of the optical system. The lens properties for a given charged particle energy can be specified (among others) in terms of three parameters: the bore diameter of the pole pieces, the pole spacing and the product of the coil windings and the excitation current NI. The magnetic lenses 2 used in applications according to the present invention, preferably have a bore diameter 12 of bigger than 5 mm to prevent excessive interactions of the charged particles with the magnetic lens.

After the charged particle beam has passed the magnetic lens 2 it enters the electrostatic lens 20. In the embodiment shown, the electrostatic lens comprises two electrodes, a first upper electrode 22 and a second lower electrode 24. In the embodiment shown, both of the electrodes-are substantially flat and circular with a bore 26 in their center. In the preferred embodiment, the center bore of one electrode has a diameter of less than 1,2 mm. Further miniaturized electrodes may have a diameter of less than 0,9 mm. The gap 28 between the electrodes should preferably be smaller than 1,2 mm. However, it is preferred to use a gap width of less than 0,9 mm. Contrary to gap 28, the distance between the lower pole piece of the magnetic lens and the upper electrode of the electrostatic lens is not as critical for the focusing properties of the objective lens. The outer diameters of the electrodes are not a critical parameter either.

The combination of the first focusing magnetic lens followed by the second focusing electrostatic lens allows a considerable reduction of the distance between the principal plane of the objective lens and the specimen and achieves a high resolving power. Thereby, the magnetic lens has the advantage of being able to perform a fine focusing without influencing the field above the sample surface. In addition, due to its miniaturization, the electrostatic lens has the advantage of further reducing the focal length. This shifts the principal plane of the objective lens closer to the sample. The objective lens system is not limited to a narrow range of primary energies of the charged particles. It can operate at low and high particle energies. Also, all kinds of scanning and correcting devices can be used together with the objective lens according to FIG. 1, if the desired application should require the use of such devices. In the embodiment shown, the scanning and correction coils are included into the finely focusing magnetic lens. Therefore, the coarsely focusing electrostatic lens can be further miniaturized.

It is preferred to arrange the miniaturized electrostatic lens directly before the specimen onto which the beam of charged particles is focused. Due to its small dimensions and its small focal length, lens defects are minimized. It is possible to use one or several electrodes for the electrostatic lens. In fact, as many electrodes as desired can be used, however, it is preferred to use at least two electrodes. This ensures sufficient focusing properties for the second focusing electrostatic lens.

In operation, the beam of charged particles is focused by the combined objective lens system. In a first step, the beam is coarsely focused by the second focusing electrostatic lens e.g. by adjusting the voltage applied to one or more of its electrodes. Thereby, the focal length of the objective lens is altered so that it roughly coincides with the distance between the objective lens and the location of the specimen to be examined. In a second step, the magnetic lens is used for finely focusing the beam of charged particles. Such a fine adjustment may be, for example, required by variations in the surface structure of the specimen. This focusing approach has the advantage of maintaining a constant electric field at the specimen surface. Thus, images are obtained without excessive influence and artifacts due to variations of the electrical field prevailing on the specimen. Also, since the fine focusing of the charged beam of particles on the specimen is done by varying the magnetic field of the first focusing lens, charging effects caused by high electrostatic fields are prevented.

The electrodes of the electrostatic lens in the embodiment shown in FIG. 1 are substantially flat and horizontal. This allows further minimization of the electrostatic lens and thus, the objective lens system. It is, however, within the scope of the invention to use electrodes having an angle of inclination with respect to the plane perpendicular to the optical axis. Such an arrangement may be preferred, for example, in combination with certain detectors for secondary products caused by the charged particles impinging on the specimen.

Figure 2:
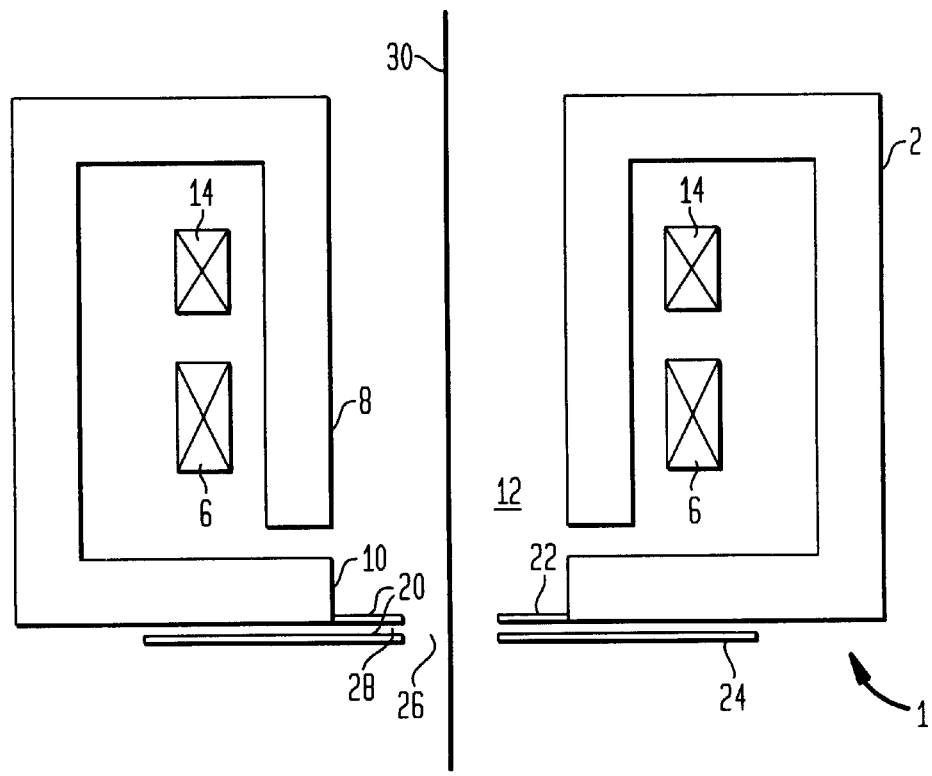
FIG. 2 shows a schematic cross section of a second embodiment of an objective lens according to the invention.

FIG. 2 shows an alternative embodiment of an objective lens according to the present invention. As in FIG. 1, the objective lens is a combination of a magnetic lens 2 and a miniaturized electrostatic lens 20. An iron circuit energized by coil 6 creates a focusing magnetic field between upper pole piece 8 and lower pole piece 10. The magnetic lens further includes scanning coils 14 for deflecting the beam of charged particles 30. There are no correction coils shown in FIG. 2. Different from the objective lens shown in FIG. 1, the upper electrode 22 of electrostatic lens 20 is integrated into the lower pole piece 10 of magnetic lens 2. Such an arrangement further minimizes the overall dimensions of the objective lens. The bore diameter of the magnetic pole pieces is preferably bigger than 5 mm. The diameter of the center bore of the upper and lower electrodes 22, 24 and the gap width 28 are the same as the respective dimensions in FIG. 1. The thickness of upper electrode 22 is chosen so that it does not influence the magnetic properties of magnetic lens 2 too strongly. Preferably, a thickness comparable to the gap width 28 is used.

FIG. 3 shows a double deflection scan system which pivots the charged particle beam 30 about the center of the miniaturized electrostatic lens 20. Upper deflection coil 32 tilts the beam of charged particles 30 from the optical axis 31 and the lower deflection coil 34 tilts the charged particle beam back toward the optical axis 31. Only the coils producing deflections in the plane of the paper are shown. The deflection coils 32, 34 in the arrangement of FIG. 3, when energized by a suitable scan generator, cause the beam to pivot about the center of the miniaturized electrostatic lens 20. The beam is thus made to deflect over the specimen in the form of a raster. The raster action is similar to that which takes place in a television tube where the beam sweeps the screen. Having the pivot point 40 in the center of the electrostatic lens, or in close vicinity to the electrostatic lens, allows to scan a larger area on the specimen 36 without having to increase the center bores of the upper and lower electrodes 22, 24. It also allows to reduce the gap width 28 between these electrodes.

Another useful facility (not shown in FIG. 3) desirable in certain applications is that of beam chopping i.e. the ability to turn the beam on and off in a controlled way over a range of frequencies. Such a chopping stage can be arranged near the charged particle source of the apparatus.

What is claimed is:

1. An objective lens for focusing a charged particle beam onto a specimen comprising:
   a first focusing lens positioned between a charged particle source and the specimen for finely focusing the beam of charged particles on the specimen;
   a second focusing lens positioned between the first focusing lens and the specimen for coarsely focusing the beam of charged particles on the specimen; and
   the second focusing lens being an electrostatic lens.

2. The objective lens according to claim 1, wherein the first focusing lens is a magnetic lens.

3. The objective lens of claim 2 wherein: (a) the electrostatic lens comprises an upper electrode and a lower electrode, the upper electrode being farther from the specimen than the lower electrode; and (b) the upper electrode is integrated into the magnetic lens.

4. The objective lens according to claim 1, wherein electrodes of the electrostatic lens are miniaturized.

5. The objective lens according to claim 1, wherein the electrostatic lens comprises at least two electrodes.

6. The objective lens according to claim 5, wherein an inner bore of the at least two electrodes of the electrostatic lens is smaller than 1.2 mm.

7. The objective lens according to claim 5, wherein a gap between the at least two electrodes of the electrostatic lens is smaller than 1.2 mm.

8. The objective lens according to claim 1 wherein the objective lens further comprises a third focusing lens positioned between the first focusing lens and the second focusing lens, wherein the first focusing lens and the second focusing lens form a double deflection scan system that provides a pivot point of the charged particle beam that is situated in close vicinity to the second focusing lens.

9. The objective lens according to claim 1 wherein the first focusing lens comprises correcting and/or scanning elements.

10. The objective lens of claim 1 wherein the electrostatic lens comprises two electrodes which are substantially flat and are both disposed substantially in planes perpendicular to an optical axis of the objective lens.

11. The objective lens of claim 1 wherein the electrostatic lens comprises two electrodes which are substantially flat and are both disposed at an angle of inclination with respect to planes perpendicular to an optical axis of the objective lens.

12. Method for focusing a charged particle beam onto a specimen comprising the following steps:
   finely focusing the charged particle beam with a first lens positioned between the charged particle source and the specimen; and
   coarsely focusing the charged particle beam with a second electrostatic lens interposed between the first lens and the specimen.

* * * * *